United States Patent
Jacobson

(10) Patent No.: US 7,073,110 B1
(45) Date of Patent: Jul. 4, 2006

(54) METHOD AND SYSTEM FOR PROGRAMMABLE BOUNDARY-SCAN INSTRUCTION REGISTER

(75) Inventor: Neil G. Jacobson, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 494 days.

(21) Appl. No.: 10/133,023

(22) Filed: Apr. 26, 2002

(51) Int. Cl.
G01R 31/28 (2006.01)

(52) U.S. Cl. .................................. 714/726
(58) Field of Classification Search ................ 714/724, 714/725, 726, 727, 729
See application file for complete search history.

(56) References Cited

U.S. PATENT DOCUMENTS 5,872,793 A * 2/1999 Attaway et al. ............ 714/726
6,408,414 B1 * 6/2002 Hatada ....................... 714/727

* cited by examiner

Primary Examiner—Albert Decady
Assistant Examiner—James C. Kerveros
(74) Attorney, Agent, or Firm—Pablo Meles; John J. King

(57) ABSTRACT

A flexible architecture for extending the instruction set for a boundary-scan interface. An instruction can be selected from a memory store (308) and decoded by a decoder (310). The instruction can subsequently be shifted into an instruction register (349) where it can be executed. Alternatively, a length of an existing instruction register (382) of a boundary-scan interface can be programmably appended to effectively increase the length of the register. A plurality of serially arranged bit registers (376, 378, 380) can be connected in series with the existing instruction register. By selecting an outer one of the serially arranged bit registers, the length of the existing instruction register can be extended.

20 Claims, 5 Drawing Sheets

METHOD AND SYSTEM FOR PROGRAMMABLE BOUNDARY-SCAN INSTRUCTION REGISTER

FIELD OF THE INVENTION

This invention relates generally to programmable logic devices, and more particularly to a method and system for flexibly programming an instruction resister in (joint test action group (JTAG)) test access port (TAP) controllers.

BACKGROUND OF THE INVENTION

As chip capacity continues to significantly increase, the use of field programmable gate arrays (FPGAs) is quickly replacing the use of application specific integrated circuits (ASICs). An ASIC is a specialized chip that is designed for a particular application. Notably, an FPGA is a programmable logic device (PLD) that has an extremely high density of electronic gates as compared to an ASIC. This high gate density has contributed immensely to the popularity of FPGA's. Importantly, FPGAs can be designed using a variety of architectures that can include user configurable input/output blocks (IOBs) and programmable/configurable logic blocks (PLBs/CLBs) having configurable interconnects and switching capability.

The advancement of computer chip technology has also resulted in the development of embedded processors and controllers. An embedded processor or controller can be a microprocessor or microcontroller circuitry that has been integrated into an electronic device as opposed to being built as a standalone module or "plugin card." Advancement of FPGA technology has led to the development of FPGA-based system-on-chip (SoC), including FPGA-based embedded processor SOCs. A SoC is a fully functional product having its electronic circuitry contained on a single chip. While a microprocessor chip requires ancillary hardware electronic components to process instructions, a SoC can include all required ancillary electronics. For example, a SoC for a cellular telephone can include a microprocessor, encoder, decoder, digital signal processor (DSP), RAM and ROM. FPGA-based SoCs with embedded operating systems (OSs) have further enhanced their popularity and flexibility.

FPGA-based SoCS have resulted in the proliferation of numerous consumer devices such as wireless telephones, personal digital assistants (PDAs), and digital cameras. In order for device manufacturers to develop FPGA-based SoCs, it is necessary for them to acquire intellectual property rights for system components and/or related technologies that are utilized to create the FPGA-based SoCs. These system components and/or technologies are called cores or IP cores. An electronic file containing component information can typically be used to represent the core. A device manufacturer will generally acquire rights for one or more IP cores that are integrated to fabricate the SoC.

Notwithstanding the advantages provided by using FPGA-based SoCs, the development of these SoCs can be very challenging. Although a vast proportion of cores lie in the public domain, a significantly greater proportion of cores are proprietary. In order to use proprietary cores, a vast quantity of time, effort and money can be spent negotiating licensing agreements. Even after the cores are licensed, great care must be taken to properly integrate the cores prior to fabrication of the FPGA-based SoCs. Integration of the cores can include simulating, modeling and debugging the integrated cores in an operating environment. These tasks can be extremely daunting and time consuming and expensive. For example, during simulation and modeling, it can take hours if not days to simulate a few milliseconds of real time operation.

Importantly, verifying logic externally by probing the external pins has become increasingly difficult, if not impossible in certain scenarios. For example, flip-chip and ball grid array (BGA) packaging do not have exposed leads that can be physically probed using external tools such as an oscilloscope. Using traditional methods, capturing traces on devices running at system speeds in excess of 200 MHz can be challenging. Furthermore, most circuit boards are small and have multiple layers of epoxy, with lines buried deep within the epoxy layers. These lines are inaccessible using an external tool. Notably, attaching headers to sockets or SoCs to aid in debugging can have adverse effects on system timing, especially in the case of a high-speed bus. Notably, attaching headers can consume valuable printed circuit board (PCB) real estate.

Boundary-scan has been used to solve physical access problems resulting from high-density assemblies and packaging technologies used in PCB design. Boundary-scan solves physical access problems by embedding test circuitry, such as test access ports (TAPs), at chip level to debug, verify and test PCB assemblies. The institute of electronic engineers (IEEE) joint test action group (JTAG) has defined a standard, JTAG TAP also known as IEEE 1149.1, that utilizes boundary-scan for debugging and verifying PCB assemblies, such as SOCs.

FGPA's and IP cores utilized for SOC applications typically employ boundary-scan techniques by integrating one or more test access ports (TAPs), which can be used to verify and debug FPGA and embedded IP core logic. Notwithstanding the advantages of boundary-scan offered by JTAG TAPs, there are inherent problems with debugging and verifying PCB assemblies that utilize multiple IP cores. For example, when multiple IP controller cores are utilized, the design arrangement of the IP controller cores can result in problems accessing each individual controller signal(s). Notably, such design arrangements are generally inflexible because they are hardwired and as a result, are permanent and non-programmable. Importantly, because of the non-programmability of such designs, designers have no choice but to test a hard-wired connection and subsequently re-wire the IP cores if changes are necessary. This often consumes a significant amount of development time, which translates directly into increased development cost.

It is possible to use to the resources in programmable logic devices to fabricate special purpose test and debug hardware. It is practical to use special purpose boundary-scan instructions and the existing boundary-scan infrastructure to control the operation of the special purpose test and debug logic. The problem though is that the number of instruction required is a function of the operations required and the complexity of the test and diagnostic requirements of the system being implemented. Given these inflexibilities and other inherent drawbacks, there is a need for a method and system for a programmable boundary-scan instruction register.

SUMMARY OF THE INVENTION

A method for extending an existing instruction set for a boundary-scan interface is provided. The method can include the step of storing at least one new instruction in a memory of the boundary-scan interface and loading one of the new instructions from the memory into a decoder. The new instruction can be decoded subsequent to being loaded into the decoder. The decoded new instruction can be shifted into an instruction register, thereby extending the existing instruction set of the boundary-scan interface and causing execution of a new task. The memory can be a memory cell of an FPGA fabric although the invention is not limited in this regard. The selecting step can further include the step of enabling an input to a selector to select the memory and causing the new instruction to be loaded from the memory into the decoder. An input to the decoder can be enabled by an output of the selector. The method can further include the step of enabling a bypass input to the selector. The bypass input to the selector can be configured to prevent the loading of the new instruction from the memory into the decoder, thereby permitting the loading of an instruction from a regular instruction set.

The invention also provides a method for flexibly programming a length of an existing instruction register in a boundary-scan interface in order to facilitate the creation of an arbitrary number of additional boundary-scan instructions. The method can include the step of providing a plurality of serially arranged bit registers which can be programmably connected in series with the existing instruction register of the boundary-scan interface. An outer one of the bit registers can be enabled, thereby causing all subsequent bit registers between the outer bit register and the existing instruction register to be enabled. The enabling step can further include the step of activating an input select signal of a selector connected to the outer bit register. The activating step can further include the step of programming a programmable bit select register to activate the input select signal of the selector connected to the outer bit register. An instruction of length (x+N) bits can be loaded into the existing instruction register of length x bits and the enabled bit registers that can have a length N. In that case N bit registers extend the actual length of the existing instruction register. The loaded instruction can be shifted through the enabled bit registers and the existing instruction register thereby causing the execution of the loaded instruction.

The invention also concerns a system for extending an existing instruction set for a boundary-scan interface. The system can include means for storing at least one new instruction in a memory of the boundary-scan interface and means for loading one of the new instructions from the memory into a decoder. The memory can be a memory cell of an FPGA fabric. The system can include a decoding means for decoding the new instruction loaded into the decoder. A shifting means can be provided to shift the decoded new instruction into an instruction register. This can result in extending the existing instruction set of the boundary-scan interface in order to execute a new task. The loading means can further include means for selecting the memory containing the new instruction. The selecting means can further include means for enabling an input to a selector to select the memory and causing the new instruction to be loaded into the decoder. The system can further include means for enabling an input to the decoder using an output of the selector. An enabling means can be provided for enabling a bypass input to the selector thereby preventing the loading of new instruction from the memory into the decoder.

The invention also concerns a system for flexibly programming a length of an existing instruction register in a boundary-scan interface in order to facilitate the creation of an arbitrary number of additional boundary-scan instructions. The system can include a plurality of serially arranged bit registers that can be programmably connected in series with the existing instruction register of the boundary-scan interface. An enabling means can be provided for enabling one outer bit register from the plurality of serially arranged bit register. In this arrangement, the enabled outer bit can advantageously enable all subsequent bit registers between the outer bit register and the existing register, thereby flexibly programming the length of the boundary-scan interface instruction register. The enabling means can further include means for activating an input select signal of a selector connected to the outer bit register. The activating means can further include means for programming a programmable bit select register to activate the input select signal of the selector connected to the outer bit register. The system can further include means for loading an instruction of length (x+N) bits into the existing instruction register of length x bits and the enabled bit registers comprising length N. A shifting means can be provided for shifting the loaded instruction through the enabled bit registers and the existing instruction register to effectuate execution of the loaded instruction.

DETAILED DESCRIPTION OF THE DRAWINGS

Figure 1:
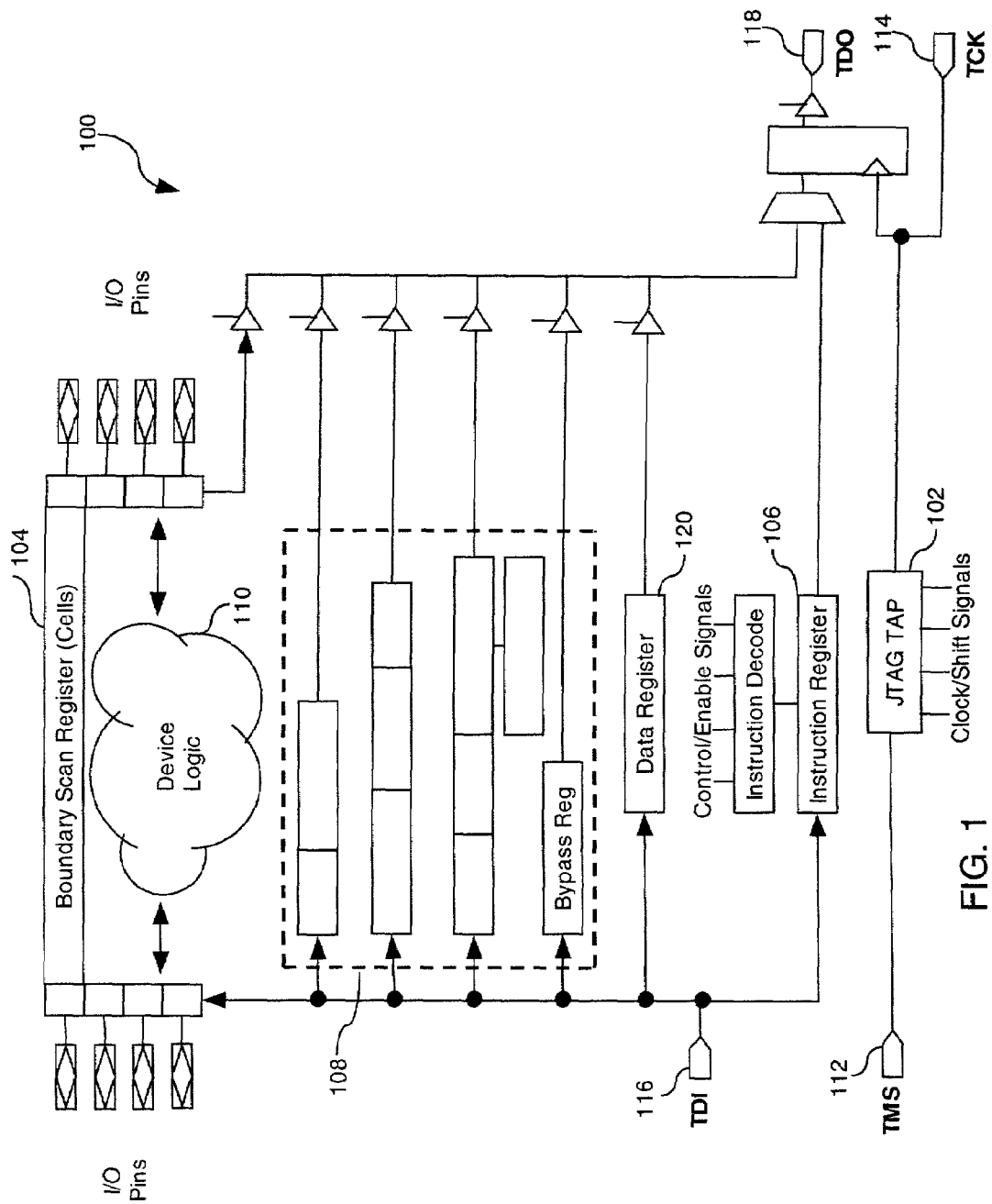
FIG. 1 is a block diagram of an exemplary JTAG boundary-scan interface.

Referring to FIG. 1, there is shown a block diagram of the architecture for a JTAG boundary-scan interface 100. The JTAG boundary-scan interface 100 includes a JTAG TAP controller 102, boundary-scan register (BSR) 104, instruction register (IR) 106, data register (DR) 120, various miscellaneous registers 108, and various control and clock signals including TMS 112, TCK 114, TDI 116 and TDO 118 as well as device logic 110. The device logic 110 is not critical to understanding the operation the JTAG boundary-scan interface 100. In various embodiments, the present invention can facilitate the creation by end users of their own IEEE Standard 1149.1 instructions in a programmable device. End users can utilize these instructions to perform debug, diagnostic and test operations or they can use it to control device specific features and functionality using the 1149.1 infrastructure. Since the variety of such operations is basically unbounded, it is important to have a mechanism that allows for as many of these instructions to be defined as possible. The present invention provides this flexibility by using on chip resources or flexibility in varying degrees to an end-user by using resources dedicated to these defined functionalities.

JTAG TAP controller 102 is implemented as a finite state machine (FSM), which depending on the inputs applied, controls the operations used for verifying and debugging a JTAG TAP compliant IP core. As a FSM, JTAG TAP controller 102 utilizes various inputs to sequence through the various states of the FSM to achieve specific functions.

Specifically, the JTAG TAP controller 102 utilizes four pins which include test mode select (TMS) 112, JTAG test clock (TCK) 114, test data input (TDI) 116 and test data out (TDO) 118, to drive the circuit block and control specific operations for the JTAG boundary-scan interface 100.

TMS 112 functions as a mode input signal to the TAP controller 102. At the rising edge of TCK 114, TMS 112 determines the TAP controller's 102 state machines' sequence. TMS 112 has an internal pull-up resistor to provide a logic 1 to the system whenever TMS 112 is not driven.

TCK 114 provides the clock sequences to the TAP controller 102, as well as all the JTAG registers including DR 120 and IR 106 and the miscellaneous registers 108.

TDI 116 functions as the serial data input to all JTAG registers including IR 106, DR 120 and miscellaneous registers 108. The contents of the TAP controller's state and the instructions in the IR 106 determine which register is fed by TDI 116 for any operation. TDI 116 has an internal pull-up resistor to provide a logic 1 to the system whenever TDI 116 is not driven. TDI 116 is loaded into the JTAG registers on the rising edge of TCK 114. Boundary-Scan instructions can be loaded via TDI directly into the instruction register (typically implemented as some sort of serial shift register). The instructions can then be latched and decoded (typically in the update-IR state, see FIG. 2). Although not necessarily precluded from doing so under the scope of the claimed invention, instructions are not loaded from an on-chip control store or memory into the instruction register. Instructions may however be loaded from an external control store or memory using a device that preferably understands the IEEE Standard 1149.1 communications protocol to load the instruction data into the target device.

TDO 118 is the serial data output for all JTAG registers including IR 106, DR 120 and miscellaneous registers 108. The state of the TAP controller 102 and the contents of the IR 106 determine which register feeds TDO 118 for a specific operation. Only one register, either IR 106 or DR 120 is connected between TDI 116 and TDO for any JTAG operation. TDO 118 changes state on the falling edge of TCK 114 and is only active during the shifting of data. TDO 118 remains in a tri-state condition at all other times.

IR 106 is a shift register-based circuit and is serially loaded with instructions that select an operation to be performed.

The DR 120, of which there can be more than one, are a bank of shift registers. The stimuli required by an operation are serially loaded into the DR(s) 120 selected by the current instruction. Following execution of the operation, results can be shifted out using TCK 114 for examination.

BSR 104 is a shift register in which a single cell is linked to every digital pin of an IP core to be tested. Each cell of the BSR 104 is called a boundary-scan cell (BSC) and connects the JTAP TAP to the internal logic of the IP core to be tested. Under normal operation of an IP core, the BSR 104 remains passive. However, the BSR becomes operational whenever the JTAG TAP controller 102 is active.

The JTAG TAP controller 102 can be a 16-state finite state machine (FSM) that controls the JTAG engine. Generally, at the rising edge of TCK 114, TMS 112 determines the TAP controller's 102 state sequence. TMS 112 has an internal pull-up resistor to provide a logic 1 to the system if TMS is not driven. The state of TMS at the rising edge of TCK determines the sequence of state transitions. There are basically two state transition paths for sampling the signal at TDI 116: one for shifting information to the IR 106 and one for shifting data into the DR 120.

Figure 2:
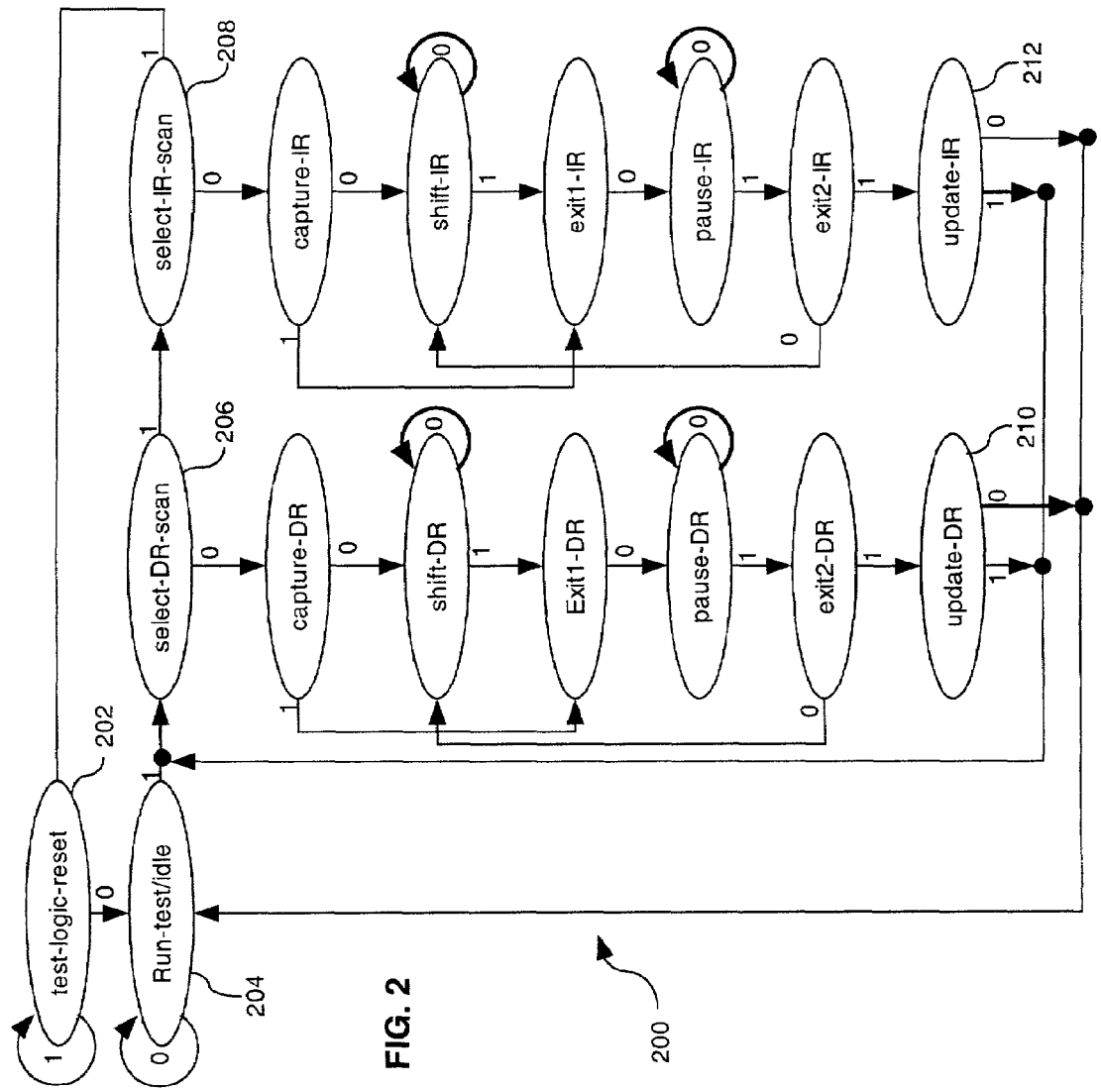
FIG. 2 is a state transition diagram for the state machine of a JTAG TAP controller utilized by the JTAG boundary-scan interface of FIG. 1.

Referring now to FIG. 2, there is shown a state transition diagram 200 for a FSM of the JTAG TAP controller 102 utilized by the JTAG boundary-scan interface of FIG. 1. With reference to FIG. 2, the following description defines the 16 states of the JTAG TAP Controller 102. The test-logic-reset state is entered on device power-up when at least five TCK 114 clocks occur with TMS 112 held high. Entry into this state resets all JTAG TAP logic so that it does not interfere with the normal component logic. At this time, an IDCODE instruction can be loaded into the IR 106.

In the run-test/idle state certain operations can occur depending on the current instruction. For example, the run-test-idle state can cause the program generation, verification, erasure and power-on-reset (POR) pulses to occur when an associated instruction is active.

The select-DR-scan is a transitional state that is entered prior to performing a scan operation on a data register. Additionally, the select-DR-scan transitional state is a state that is entered while transitioning to the select-IR-scan state.

The select-IR-scan is a transitional state entered prior to performing a scan operation on the instruction register or when returning to the test-logic-reset state.

The capture-DR state permits the loading of data from parallel inputs into the data register selected by the current instruction. Loading of data occurs at the rising edge of TCK 114. If the selected DR 120 has no parallel inputs, the DR 120 remains in its current state.

In the shift-DR state, data is shifted by one stage in the currently selected register from TDI 116 towards TDO 118 on each rising edge of TCK 114.

The exit1-DR is a transitional state that permits a transition to the pause-DR state or a transition directly to the update-DR state.

The pause-DR is a wait state that permits shifting of data to be temporarily halted.

The Exit2-DR is a transitional state that permits a transition to the update-DR state or a return to the shift-DR state to continue accepting data.

In the update-DR state, the data contained in the currently selected DR is loaded into a latched parallel output for registers that have a latch. Loading occurs on the falling edge of TCK 114 after entering the update-DR state. The parallel latch prevents changes at the parallel register output from occurring during the shifting process.

In the capture-IR state, data gets loaded from parallel inputs into the instruction register on the rising edge of TCK 114. The least two significant bits of the parallel inputs must have the value 01, and the remaining 6 bits are either hard-coded or used for monitoring security and data protect bits.

In the shift-IR state, data in the IR gets shifted one state towards TDO 118 on each rising edge of TCK 114.

The exit1-IR is a transitional state that permits a transition to the pause-IR state or the update-IR state.

The pause-IR permits shifting of an instruction to be temporarily halted.

The exit2-IR is a transitional state that permits either passage to the update-IR state or a return to the shift-IR state to continue shifting in data.

In the update-IR, state IR 106 values are parallel latched on the falling edge of TCK 114. The parallel latch prevents changes at the parallel output of the instruction register from occurring during the shifting process.

Referring to FIG. 2, the initial state of the JTAG TAP controller 102 is test-logic-reset 202. While in the test-logic-reset state 202, an input of 1 causes the JTAG TAP controller 102 to remain in the test-logic-reset state 202. However, an input of 0 results in a jump to the run-test/idle state 204. While in the run-test/idle state 204, an input of 0 causes the JTAG TAP controller 102 to remain in the run-test/idle state 204. However, an input of 1 results in a transition to the select-DR-scan state 206.

Once the select-DR-scan state 206 is entered, all other DR 120 operations are sequenced from the select-DR-scan state as shown in the diagram 200. While in the select-DR-scan state 206, an input of a 1 causes a transition to the select-IR-scan state 208. Once the select-IR-scan state 208 is entered, all other IR operations are sequenced from the select-IR-scan state 208 as shown in the state transition diagram 200. An input of a 1 while in the select-IR state 208 causes a transition to the test-logic-reset state 202.

An input of a 0 while in an update-DR state 210 or an update-IR state 212 results in the JTAG TAP controller 102 returning to the run-test/idle state 204. However, an input of a 1 while in the update-DR state 210 or the update-IR state 212 results in the JTAG TAP controller 102 returning to the select-DR-scan state 206.

Figure 3A:
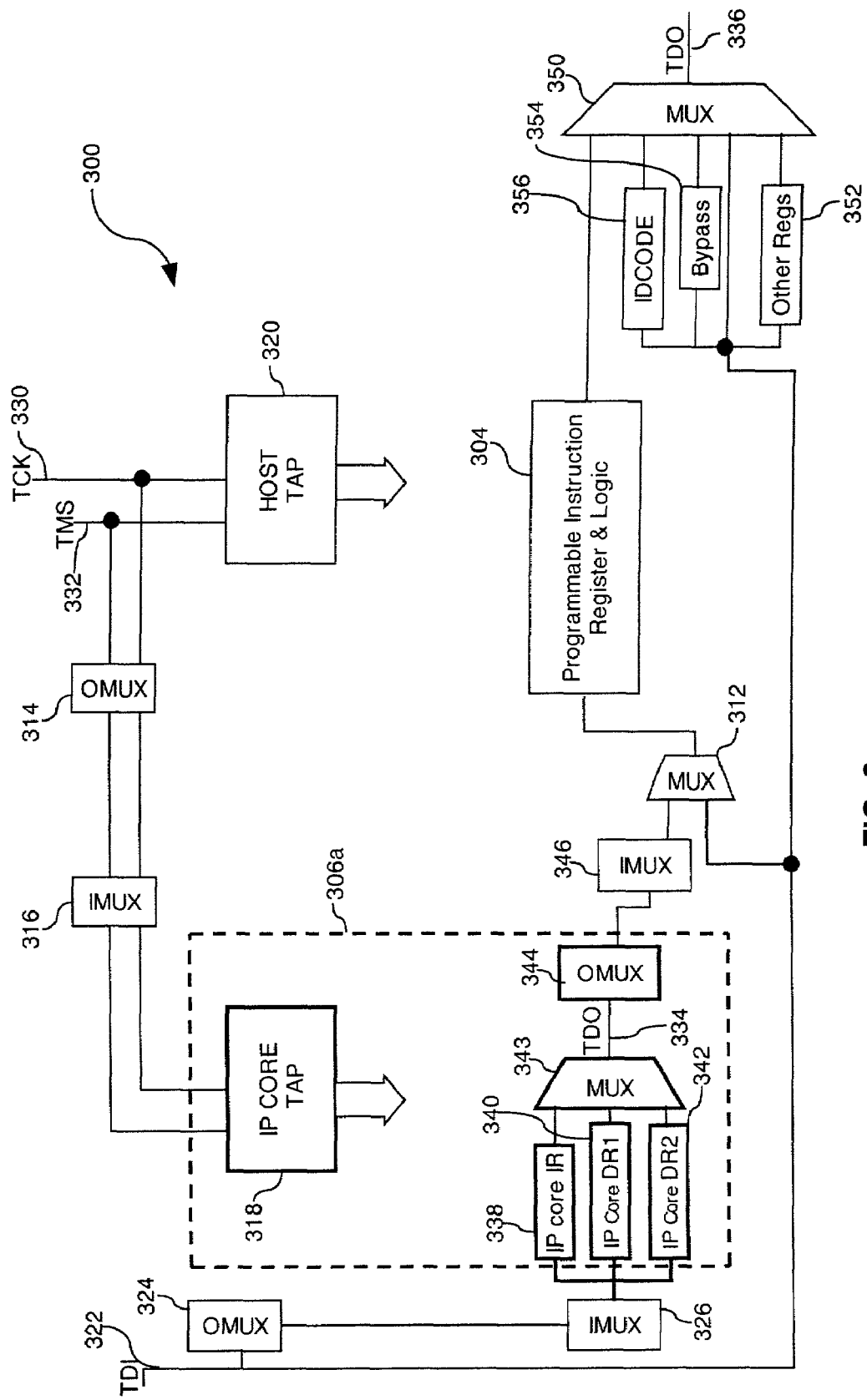
FIG. 3a illustrates an exemplary system for a programmable boundary-scan interface in accordance with the inventive arrangements.

FIG. 3a illustrates an exemplary system 300 for a programmable boundary-scan interface in accordance with the inventive arrangements. Referring to FIG. 3, a programmable instruction register and associated logic 304 advantageously provides flexibility in the JTAG TAP architecture by permitting the programming of various instruction register lengths and extending of the instruction sets. In operation, signals from host tap 320 can be multiplexed or otherwise connected to the IP processor core TAP 318. TMS signal 332 and TCK signal 330 from host TAP 320 can be connected to IP processor core 318 using output multiplexer (OMUX) 314 and input multiplexer 316. IMUXes and OMUXes are known in the art. Notwithstanding, IMUXs and OMUXs can be used to programmably connect to elements in the FPGA such as the configurable logic blocks (CLBs). Additionally, the IMUXes and OMUXes can connect to the IP processor core(s) and the JTAG TAP signals TCK 330, TDI 322, TDO 336, and TMS 332. Importantly, it should be recognized that the invention is not limited to the precise arrangements shown in FIG. 1.

TDI signal 322 can be connected to an embedded processor core 306a through OMUX 324 and IMUX 326. OMUX 324 and IMUX 326 can provide access to the signals and registers. Although only connections to the IP processor core IR 338 and IP processor core DR1 340 and IP processor core DR2 342 are shown, the invention is not limited in this regard. The resulting output signals from IP processor core IR 338 and IP processor core DR1 340 and IP processor core DR2 342 can be multiplexed by MUX 343 to create the resulting TDO signal 334. TDO signal 334 can change state on the falling edge of TCK 330 and can be configured to be active only during the shifting of data through the embedded processor core 306a. At all other times, TDO signal 334 can remain in a tri-state condition. TDO signal 334 can subsequently be processed by OMUX 344 and IMUX 346 respectively. The resulting signal from IMUX 346 is then connected as an input to the multiplexer 312.

TDI signal 322 can also act as an input to multiplexer 312. The output of multiplexer 312 can be coupled to the programmable instruction register and logic 304. Multiplexer 350 can subsequently multiplex the output of the programmable instruction register and logic 304 and any output from registers 356, 354, 352 and TDI signal 322 to create the output TDO signal 336.

Figure 3B:
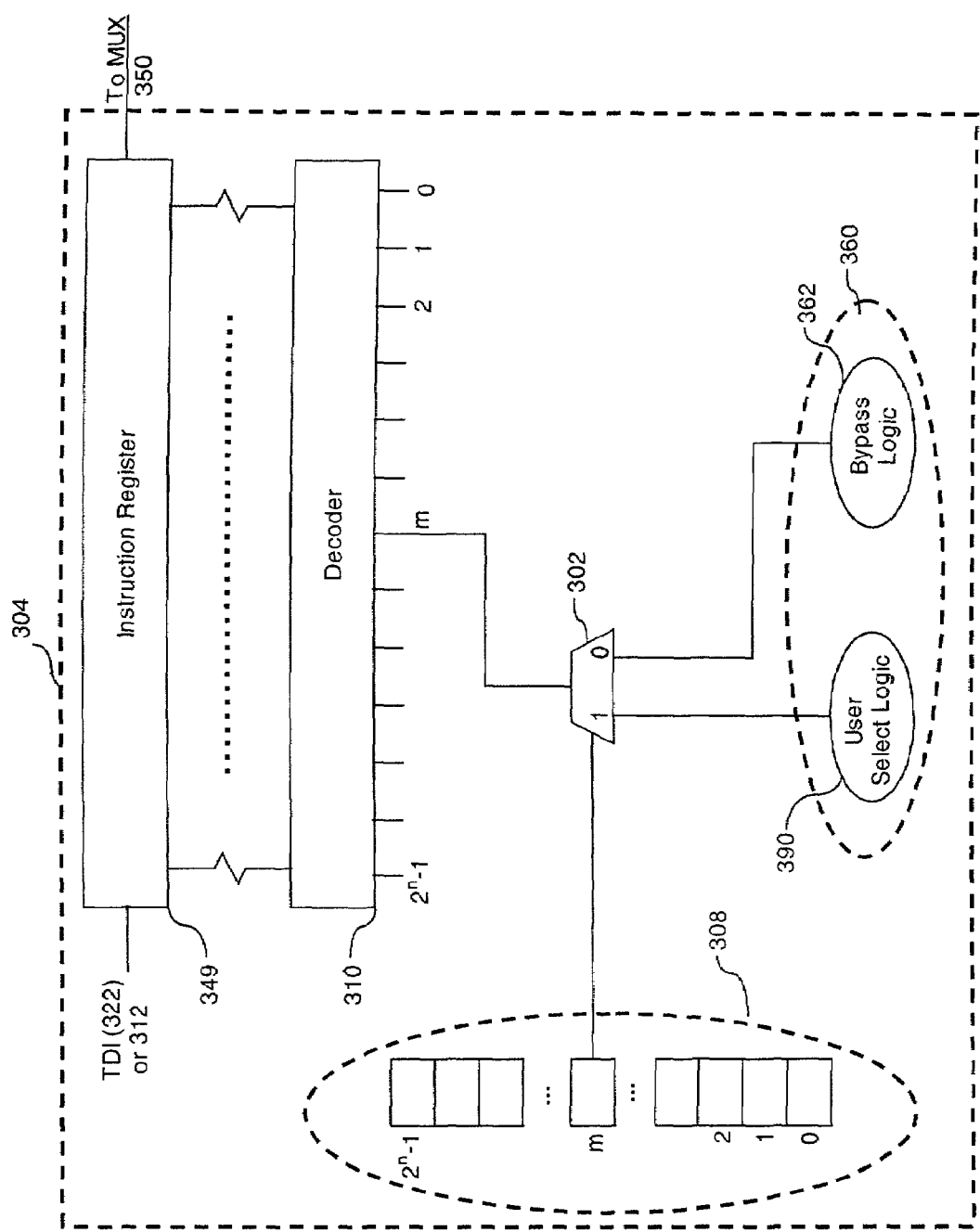
FIG. 3b illustrates an exemplary system for extending the instruction set for a boundary-scan interface in accordance with the inventive arrangements.

FIG. 3b illustrates an exemplary system for extending the instruction set for a boundary-scan interface in accordance with the inventive arrangements. Referring to FIG. 3b, there is shown a more detailed illustration of the programmable instruction register and logic 304 comprising an instruction register 349, a decoder 310, a selector 302, memory store 308, and logic circuitry 360. Logic circuitry 360 can include separate user select logic 390 and bypass logic 362, although the invention is not limited in this regard. User select logic 390 can be coupled to selector 302 and configured to activate the loading of an instruction from a memory location in memory store 308 into the decoder 310. However, bypass logic 362 can be coupled to selector 302 and configured to deactivate the loading of an extended instruction set into the decoder 310. In that case, only the normal instruction set would be available.

The memory store 308 can be comprised of memory cells, which are part of an FPGA fabric, although the invention is not limited in this regard. Memory store 308 can be coupled to selector 302 and can store user-defined instructions, which can be used to extend an existing instruction set for boundary-scan interface 100. Memory store 308 can be configured to have as many memory locations as can be required for each corresponding instruction. Similarly, decoder 310 can be configured to have as many inputs as there are memory locations in the memory cell 308. In this case, memory store 308 can have $2^n$ locations to store instructions, although not all locations need be utilized. Similarly, the decoder 310 has $2^n$ inputs, with each input corresponding to one of the $2^n$ memory locations in memory store 308. The memory cells are used to indicate which instruction code patterns are being utilized by a designer. When an instruction pattern is utilized, the associated bit is set. When the particular instruction is loaded into the instruction register, the selector 302 indicates the instruction is active and the memory bit indicates that the instruction is utilized. The associated data register is then activated. If the instruction is not utilized, the memory bit is not active and then the BYPASS register is selected as required by IEEE Standard 1149.1

Selector 302 can be configured to couple a particular memory location of memory store 308 to a particular decoder input of decoder 310. For example, selector 302 can be configured to couple memory location m of memory store 308 to the input m of decoder 310. User select logic 390 can enable selector 302 to facilitate the loading of an instruction stored in memory location m into decoder 310. Importantly, the output of selector 302 enables the m input of decoder 310. Subsequent to loading the instruction into the decoder 310, the decoded instruction can be shifted into instruction register 349.

Figure 3C:
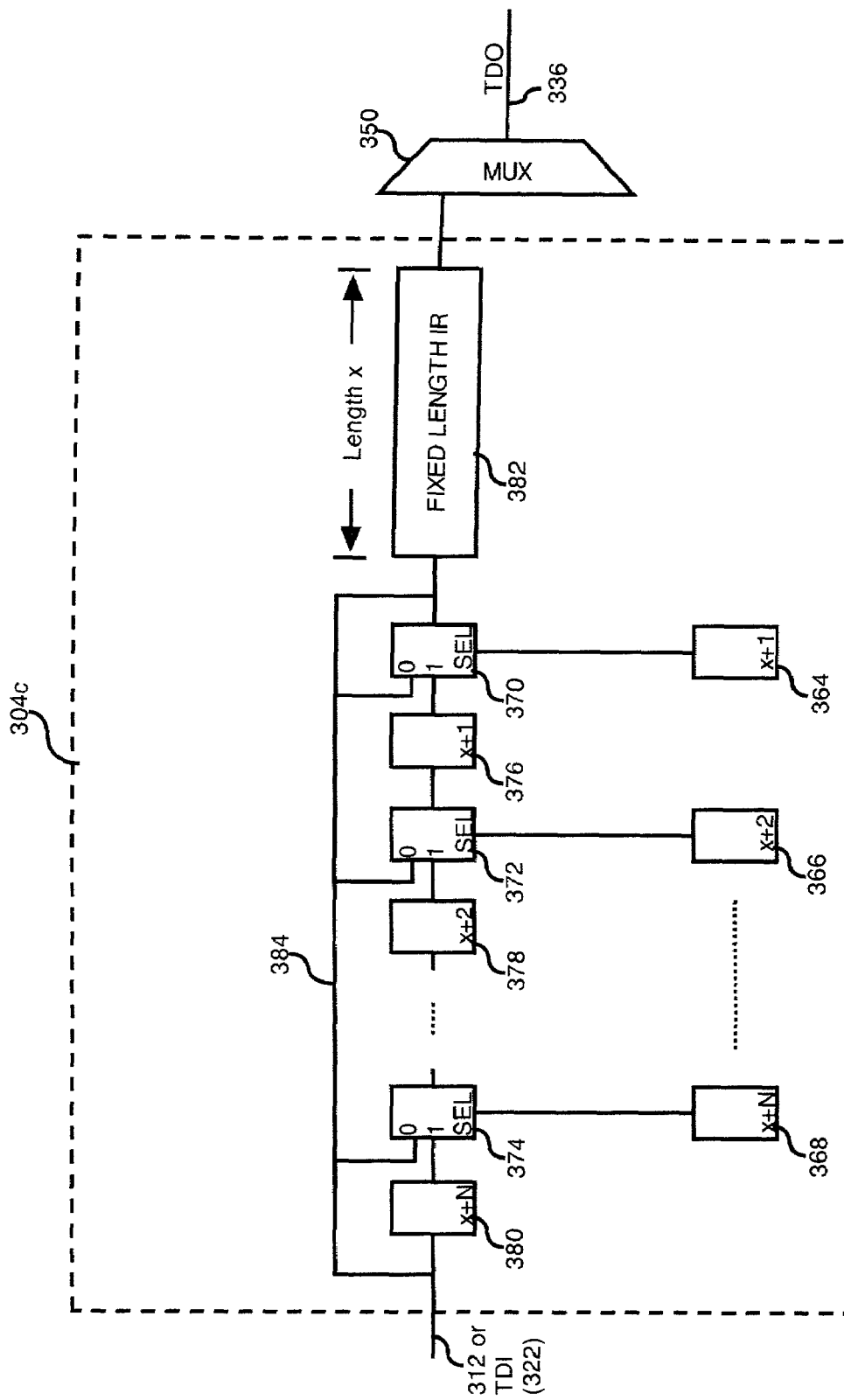
FIG. 3c illustrates an exemplary system for programming the length of and instruction register for a boundary-scan interface in accordance with the inventive arrangements.

FIG. 3c illustrates an exemplary system for programming the length of and instruction register for a boundary-scan interface in accordance with the inventive arrangements. Advantageously, the arrangements of FIG. 3c provides a system and method for flexibly programming the length of an instruction register using an alternative embodiment of the programmable instruction register and logic 304c. Referring to FIG. 3c, there is shown an existing fixed length instruction register 382 coupled to a plurality of serially connected bit registers 376, 378, . . . 380. Each of the bit registers 376, 378, . . . 380 can be coupled to a selector 370, 372, . . . 374 respectively. Each of the selectors 370, 372, . . . 374 can be coupled to programmable bit select registers 364, 366, . . . 368 respectively.

The bit registers 376, 378, . . . 380 can be configured to programmably extend the length of the existing fixed length instruction register 382. Preferably, bit register 380 can be the most significant bit of the serially connected bit registers. Similarly, bit register 376 can be the least significant bit of the serially connected bit registers. Bit register 376 can also be the bit register that is connected closest to the fixed length instruction register 382. Notably, varying instruction register lengths can be programmably selected with the selection of the most significant bit register providing a maximum length or ceiling.

Input TDI signal 322 can be connected to the most significant bit register 380 and all the selectors 370, 372, and 374 by utilizing connection 384. Connection 384 can be configured to act as a bypass signal which routes TDI signal 322 directly to fixed length instruction register 382.

In operation, selection of an outer one of the bit registers can result in the selection of all the bit registers that are between the selected outer bit register and the fixed length instruction register 382. For example, selection of the most significant bit register 380 can result in the selection of all bit registers between 380 and the fixed length instruction register 382. This would include bit register 376 and 378. In this case, the outer bit would be the most significant bit 380 and the length of the existing fixed length instruction register would be extended by N bits, providing a total length of x+N. In a case where selector 372 was enabled, then the outer bit register would be bit register 378 and the length of the existing fixed length instruction register would be extended by 2 bits. In a case where none of the selectors 370, 372, . . . , 374 were enabled, then the TDI signal bypasses all the bit registers 376, 378, . . . , 380 via connection 384, and goes directly into the existing fixed length instruction register. Consequently, existing fixed length instruction register 382 is not extended.

The programmable bit register can be programmed to enable the selector to which it is coupled. A logic 1 can act as an enable signal while a logic 0 can act as a disable signal although the invention is not limited in this regard. Notwithstanding, it should be noted that the invention is not limited in this regard. For example, whenever the programmable bit register 368 is programmed to enable (1) the selector 374, TDI 322 can be loaded into the bit register 380, which makes the output of selector 374 enable the subsequent bit register x+N−1 (not shown). This process can be successively repeated, thereby resulting in all subsequent bit registers being enabled, including 378 and 376. In this case the outer bit register would be 380. Similarly, whenever the programmable bit register 366 is programmed to enable (1) the selector 372, TDI 322 can be loaded into the bit register 380, which makes the output of selector 374 enable the subsequent bit register x+2. The output of the selector 372 enables the input to selector 372, thereby enabling bit register 376. In this case the outer bit register would be 378 and the fixed length instruction register 382 would be extended by and additional 2 bits.

In light of the foregoing description of the invention, it should be recognized that the present invention can be realized in hardware, software, or a combination of hardware and software. A method and system for flexibly nesting JTAG TAP controllers in an FPGA-based SoCs such as FPGA-based embedded processor SoCs according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Although the description above has been described with specific application to boundary-scan, the present invention is not precluded from being used in other infrastructures. Additionally, the description above is intended by way of example only and is not intended to limit the present invention in any way, except as set forth in the following claims.

What is claimed is:

1. A method for extending an existing instruction set for a boundary-scan interface, the method comprising:
   providing a programmable instruction register for enabling a variable number of instructions of an instruction set;
   storing at least one new instruction in a memory of the boundary-scan interface to extend the existing instruction set of the boundary scan interface;
   loading one of said at least one new instruction from said memory into a decoder;
   decoding said new instruction loaded into said decoder; and
   causing execution of a new task.

2. The method according to claim 1, wherein said loading step further comprises the step of selecting said memory of the boundary-scan interface comprising said new instruction.

3. The method according to claim 2, wherein said selecting step further comprises the step of enabling an input to a selector to select said memory, said enabling step causing said new instruction to be loaded into said decoder.

4. The method according to claim 3, further comprising the step of enabling an input to said decoder using an output of said selector.

5. The method according to claim 3, further comprising the step of enabling a bypass input to said selector, said bypass input to said selector preventing the loading of said new instruction from said memory into said decoder.

6. The method according to claim 1, wherein said storing step further comprises the step of storing said new instruction in a memory cell of an FPGA fabric comprising the boundary-scan interface.

7. A method for flexibly programming a length of an existing instruction register in a boundary-scan interface, the method comprising:
   providing a plurality of serially arranged bit registers, said serially arranged bit registers programmably connected in series with the existing instruction register of the boundary-scan interface; and
   enabling one outer bit register from said plurality of serially arranged bit registers, said enabled outer bit register enabling all subsequent bit registers between said outer bit register and the existing register, thereby flexibly programming the length of the boundary-scan interface instruction register.

8. The method according to claim 7, wherein said enabling step further comprises the step of activating an input select signal of a selector connected to said outer bit register.

9. The method according to claim 8, wherein said activating step further comprises the step of programming a programmable bit select register to activate said input select signal of said selector connected to said outer bit register.

10. The method according to claim 7, further comprising:
loading an instruction of length (x+N) bits into the existing instruction register of length x bits and said enabled bit registers comprising length N; and
shifting said loaded instruction through said enabled bit registers and the existing instruction register, said shifting step causing the execution of said loaded instruction.

11. A system for extending an existing instruction set for a boundary-scan interface, the system comprising:
means for programmably enabling a variable number of instructions of an instruction set;
means for storing at least one new instruction in a memory of the boundary-scan interface;
means for loading one of said at least one new instruction from said memory into a decoder;
means for decoding said new instruction loaded into said decoder; and
means for causing the execution of a new task.

12. The system according to claim 11, wherein said loading means further comprises means for selecting said memory of the boundary-scan interface comprising said new instruction.

13. The system according to claim 12, wherein said selecting means further comprises the means for enabling an input to a selector to select said memory, said enabling means causing said new instruction to be loaded into said decoder.

14. The system according to claim 13, further comprising means for enabling an input to said decoder using an output of said selector.

15. The system according to claim 13, further comprising means for enabling a bypass input to said selector, said bypass input to said selector preventing the loading of said new instruction from said memory into said decoder.

16. The system according to claim 11, wherein said storing means is a memory cell of an FPGA fabric comprising the boundary-scan interface.

17. A system for flexibly programming a length of an existing instruction register in a boundary-scan interface, the system comprising:
a plurality of serially arranged bit registers, said serially arranged bit registers programmably connected in series with the existing instruction register of the boundary-scan interface; and
means for enabling one outer bit register from said plurality of serially arranged bit register, said enabled outer bit register enabling all subsequent bit registers between said outer bit register and the existing register, thereby flexibly programming the length of the boundary-scan interface instruction register.

18. The system according to claim 17, wherein said enabling means further comprises means for activating an input select signal of a selector connected to said outer bit register.

19. The system according to claim 18, wherein said activating means further comprises means for programming a programmable bit select register to activate said input select signal of said selector connected to said outer bit register.

20. The system according to claim 17, further comprising:
means for loading an instruction of length (x+N) bits into the existing instruction register of length x bits and said enabled bit registers comprising length N; and
means for shifting said loaded instruction through said enabled bit registers and the existing instruction register, said shifting causing the execution of said loaded instruction.

* * * * *